United States Patent
Lin et al.

(10) Patent No.: US 7,821,340 B2
(45) Date of Patent: Oct. 26, 2010

(54) OUTPUT STAGE CIRCUIT AND OPERATIONAL AMPLIFIER

(75) Inventors: Kun-Tsung Lin, Tai Chung (TW); Kuei-Kai Chang, Hsin Chu County (TW)

(73) Assignee: Orise Technology Co., Ltd., Hsinchu (TW)

( * ) Notice: Subject to any disclaimer, the term of this patent is extended or adjusted under 35 U.S.C. 154(b) by 0 days.

(21) Appl. No.: 12/534,445

(22) Filed: Aug. 3, 2009

(65) Prior Publication Data

US 2010/0033251 A1    Feb. 11, 2010

(30) Foreign Application Priority Data

Aug. 8, 2008    (TW) ............................... 97130360 A

(51) Int. Cl.
*H03F 3/18*    (2006.01)

(52) U.S. Cl. ...................................... 330/264; 330/255

(58) Field of Classification Search ................. 330/264, 330/255, 260, 69
See application file for complete search history.

(56) References Cited

U.S. PATENT DOCUMENTS

| | | | |
|---|---|---|---|
| 5,210,506 A * | 5/1993 | Koch et al. | 330/255 |
| 6,255,909 B1 * | 7/2001 | Muza | 330/264 |
| 6,559,721 B2 * | 5/2003 | Ausserlechner et al. | 330/264 |
| 6,794,942 B2 * | 9/2004 | Smith | 330/264 |
| 7,057,459 B2 * | 6/2006 | Ueno | 330/255 |
| 7,570,116 B2 * | 8/2009 | Haila et al. | 330/264 |

* cited by examiner

*Primary Examiner*—Henry K Choe
(74) *Attorney, Agent, or Firm*—Muncy, Geissler, Olds & Lowe, PLLC

(57) ABSTRACT

An output stage circuit is disclosed, which includes a first PMOS transistor, a second PMOS transistor, a first NMOS transistor, and a second NMOS transistor. By using twin-well CMOS transistors and a specific circuit configuration, the invention supports a HALF AVDD structure, reduces power consumption and saves the cost of triple-well CMOS process.

20 Claims, 10 Drawing Sheets

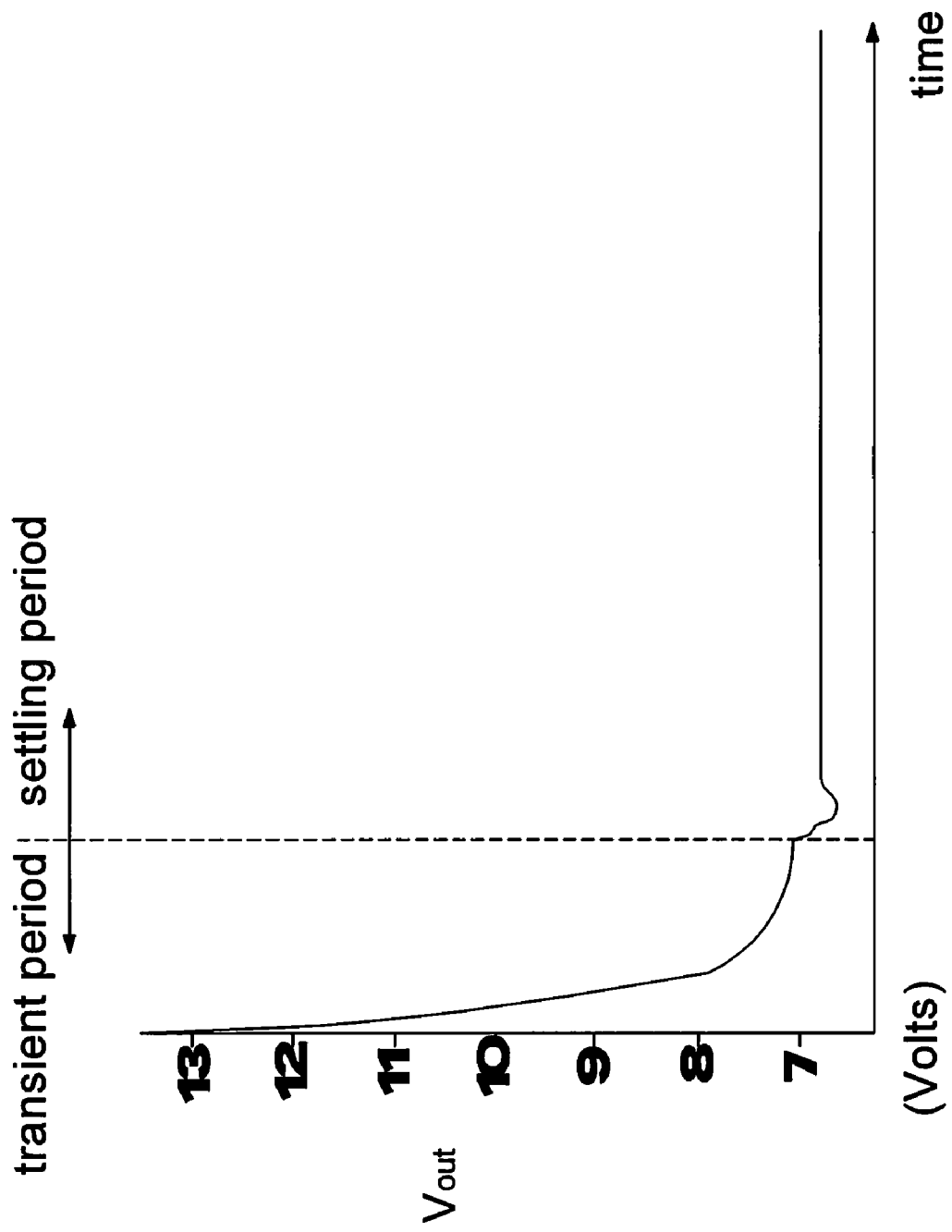

US 7,821,340 B2

OUTPUT STAGE CIRCUIT AND OPERATIONAL AMPLIFIER

This application claims the benefit of the filing date of Taiwan Application Ser. No. 097130360, filed on Aug. 8, 2008, the content of which is incorporated herein by reference.

BACKGROUND OF THE INVENTION

1. Field of the Invention

The invention relates to operational amplifiers, particularly to an operational amplifier supporting a HALF AVDD structure and implemented using traditional twin-well CMOS transistors.

2. Description of the Related Art

If continuously applied with a DC voltage, the liquid crystal material is damaged. To prevent the damage to the liquid crystal material, the polarity of each data signal applied to the liquid crystal material is periodically inverted (so-called AC driving), as well know in the art. With respect to traditional liquid crystal display (LCD) driving integrated circuits (IC) operating at a positive voltage system, only two operating voltages AVDD (13.5 V or 16V) and VSS are provided (hereinafter called "AVDD structure"). Based on the AVDD structure, after a channel voltage is pulled down from AVDD to VSS, charges are normally wasted. Accordingly, the ratio of power consumption of a traditional LCD panel to total power consumption is up to 70%; besides, as the sizes of the LCD panels are getting larger, it further causes overheating of the panels.

An effective solution has been proposed to deal with the above-mentioned problem. In addition to the two operating voltages AVDD and VSS, a third operating voltage HALF AVDD (hereinafter called "HALF AVDD structure") is provided to the LCD driving IC. The feature of the HALF AVDD structure is that charges are collected while positive channels discharge to the operating voltage HALF AVDD and then the collected charges are provided for negative channels to charge via the operating voltage HALF AVDD. Accordingly, the HALF AVDD structure saves power consumption and prevents overheating of LCD panels. FIG. 1 is a schematic diagram showing two conventional operational amplifiers supporting the HALF AVDD structure and four switches located at two neighboring channels Y(n) and Y(n+1) in a source driver (not shown). Referring to FIG. 1, the operational amplifier 110, supporting the HALF AVDD structure and located at the channel Y(n), operates between AVDD and HALF AVDD while the operational amplifier 120, supporting the HALF AVDD structure and located at the channel Y(n+1), operates between HALF AVDD and VSS. The voltages of positive analog image signals A+ generated by the operational amplifier 110 range from AVDD to HALF AVDD while the voltages of negative analog image signals A− generated by the operational amplifier 110 range from HALF AVDD to VSS. By controlling four switches SW1~SW4, a positive analog image signal A+ and a negative analog image signal A− are alternately output from the channels Y(n) and Y(n+1) to the panel for every predetermined period of time.

However, according to the prior arts, MOS transistors fabricated using triple-well CMOS process are prerequisite for the operational amplifiers 110 and 120 able to support the HALF AVDD structure. Take a NMOS transistor for example; an additional process of a deep n-well is required to isolate a p-well and a p-substrate according to the triple-well scheme. The triple-well CMOS process is a high-cost technology and not popular yet in Taiwan. However, it is sure that the cost of the triple-well CMOS process must be higher than that of the twin-well CMOS process.

SUMMARY OF THE INVENTION

In view of the above-mentioned problems, an object of the invention is to provide an output stage circuit, which is implemented using conventional twin-well CMOS transistors, achieving the purpose of supporting the HALF AVDD structure.

To achieve the above-mentioned object, the output stage circuit of the invention comprises: a first PMOS transistor, the bulk of the first PMOS transistor being connected to a first operating voltage, the drain of the first PMOS transistor being connected to a first mid level voltage, and the gate of the first PMOS transistor being connected to a first control signal; a second PMOS transistor, the bulk and the source of the second PMOS transistor being connected to the first operating voltage, and the gate of the second PMOS transistor being connected to a second control signal; a first NMOS transistor, the drain of the first NMOS transistor being connected to a second mid level voltage, the bulk of the first NMOS transistor being connected to a second operating voltage, and the gate of the first NMOS transistor being connected to a third control signal, wherein the second operating voltage is less than the first operating voltage; and, a second NMOS transistor, the source and the bulk of the second NMOS transistor being connected to the second operating voltage, and the gate of the second NMOS transistor being connected to a fourth control signal; wherein the transistors are fabricated using twin-well CMOS process and the drains of the transistors are connected to each other at an output terminal, and wherein at least one of the control signals is enabled to turn on at least one of the transistors correspondingly for each time interval.

Another object of the invention is to provide an operational amplifier having a positive input terminal, a negative input terminal and an output terminal. The negative input terminal and the output terminal are shorted together. The operational amplifier comprises: an input stage circuit and an output stage circuit. The input stage circuit enables at least one of a first control signal, a second control signal, a third control signal and a fourth control signal according to two input voltages at the positive input terminal and the negative input terminal. The output stage circuit comprises: a first PMOS transistor, the bulk of the first PMOS transistor being connected to a first operating voltage, the drain of the first PMOS transistor being connected to a first mid level voltage, and the gate of the first PMOS transistor being connected to the first control signal; a second PMOS transistor, the bulk and the source of the second PMOS transistor being connected to the first operating voltage, and the gate of the second PMOS transistor being connected to the second control signal; a first NMOS transistor, the source of the first NMOS transistor being connected to a second mid level voltage, the bulk of the first NMOS transistor being connected to a second operating voltage, and the gate of the first NMOS transistor being connected to the third control signal; and, a second NMOS transistor, the source and the bulk of the second NMOS transistor being connected to the second operating voltage, and the gate of the second NMOS transistor being connected to a fourth control signal, wherein the transistors are fabricated using twin-well CMOS process and the drains of the transistors are connected at the output terminal.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6C is a simulation result showing the output voltage $V_{out}$ of the operational amplifier according to circuit configurations in FIGS. 6A and 6B.

DETAILED DESCRIPTION OF THE INVENTION

The invention takes the source drive circuit of a LCD device as an example for explanation. However, an output stage circuit and an operational amplifier according to the invention can also be applied in other integrated circuits that need to support the HALF AVDD structure.

Figure 2A:
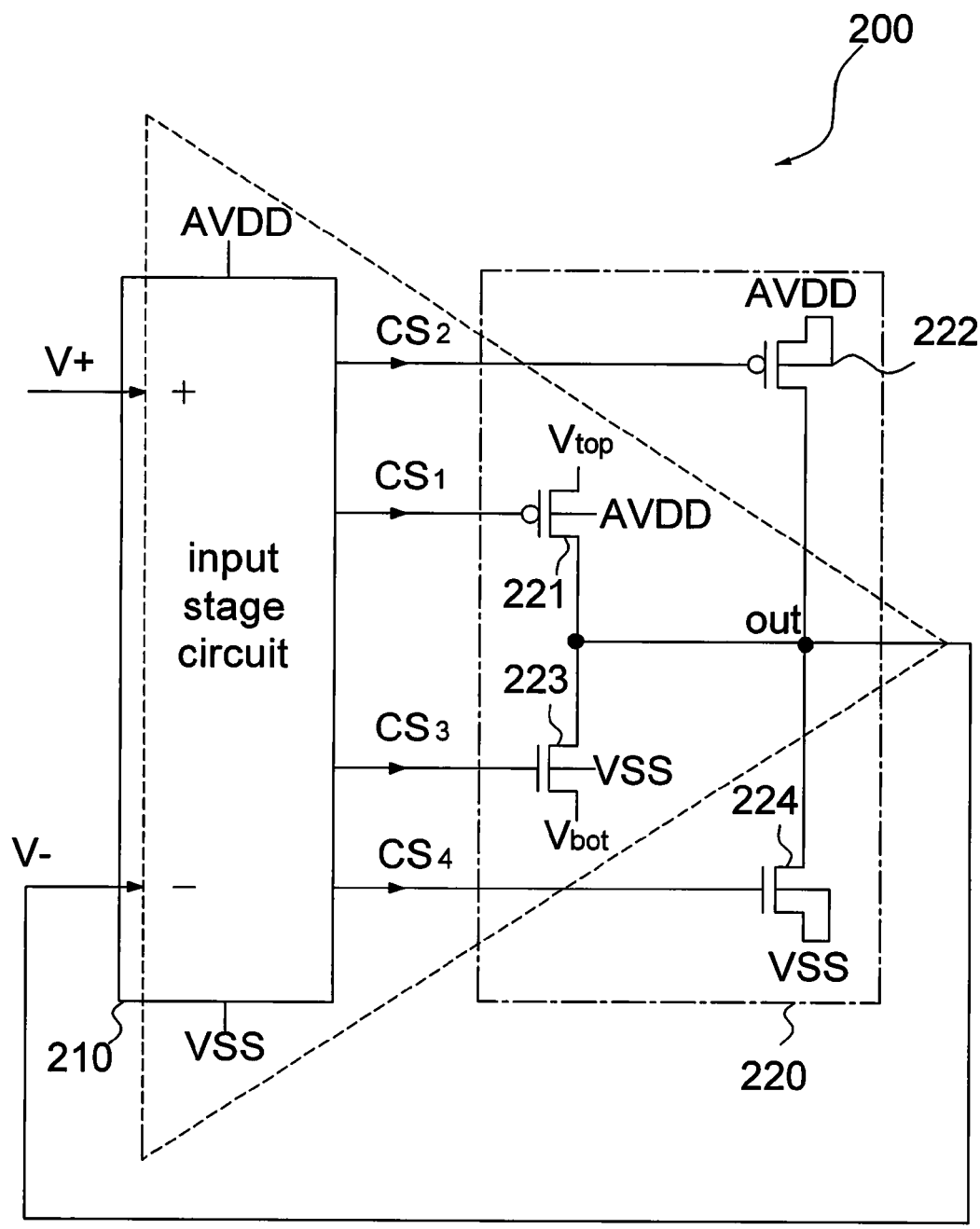
FIG. 2A is a schematic block diagram showing an operational amplifier according to an embodiment of the invention.

FIG. 2A is a schematic block diagram showing an operational amplifier according to an embodiment of the invention. Referring to FIG. 2A, an operational amplifier 200 of the invention, having a positive input terminal, a negative input terminal and an output terminal, includes an input stage circuit 210 and an output stage circuit 220. The input stage circuit 210, operating at two operating voltages AVDD and VSS, respectively receives a positive input voltage V+ and a negative input voltage V− and enables at least one of four control signals CS1, CS2, CS3 and CS4 according to the voltages V+ and V−.

The output stage circuit 220 includes two PMOS transistors 221 and 222 and two NMOS transistors 223 and 224. The drains of the four transistors 221, 222, 223 and 224 are connected to each other at the output terminal out and the output terminal out is connected to the negative input terminal. Regarding the PMOS transistor 221, its bulk is connected to the operating voltage AVDD, its source is connected to a mid level voltage $V_{top}$, and its gate receives the control signal CS1 (low active, for example). Regarding the PMOS transistor 222, its bulk and source are connected to the operating voltage AVDD and its gate receives the control signal CS 2. Regarding the NMOS transistor 223, its source is connected to a mid level voltage $V_{bot}$, its bulk is connected to the operating voltage VSS and its gate receives the control signal CS3. Regarding the NMOS transistor 224, its bulk and source are connected to the operating voltage VSS and its gate receives the control signal CS4. The mid level voltages $V_{top}$ and $V_{bot}$ are greater than VSS and less than AVDD. In this embodiment, the mid level voltages $V_{top}$ and $V_{bot}$ are connected to an operating voltage HALF AVDD. It should be noted that the mid level voltages $V_{top}$ and $V_{bot}$ can be modified depending on circuit design.

According to the invention, the four transistors 221, 222, 223 and 224 are fabricated using twin-well CMOS process. The differences in circuit configurations of the four transistors 221, 222, 223 and 224 are as follows. The difference (i.e., $V_{SB} \neq 0$) between the source voltage Vs and the bulk voltage $V_B$ in each of the PMOS transistor 221 and the NMOS transistor 223 causes body effect; in contrast, the source voltage Vs and the bulk voltage $V_B$ in each of the PMOS transistor 222 and the NMOS transistor 224 are equal (i.e., $V_{SB}=0$) and thus will not cause any body effect. As the threshold voltage increases due to body effect, the conductive current $I_{DS}$ is reduced and thus makes the driving capability weak.

Figure 3:
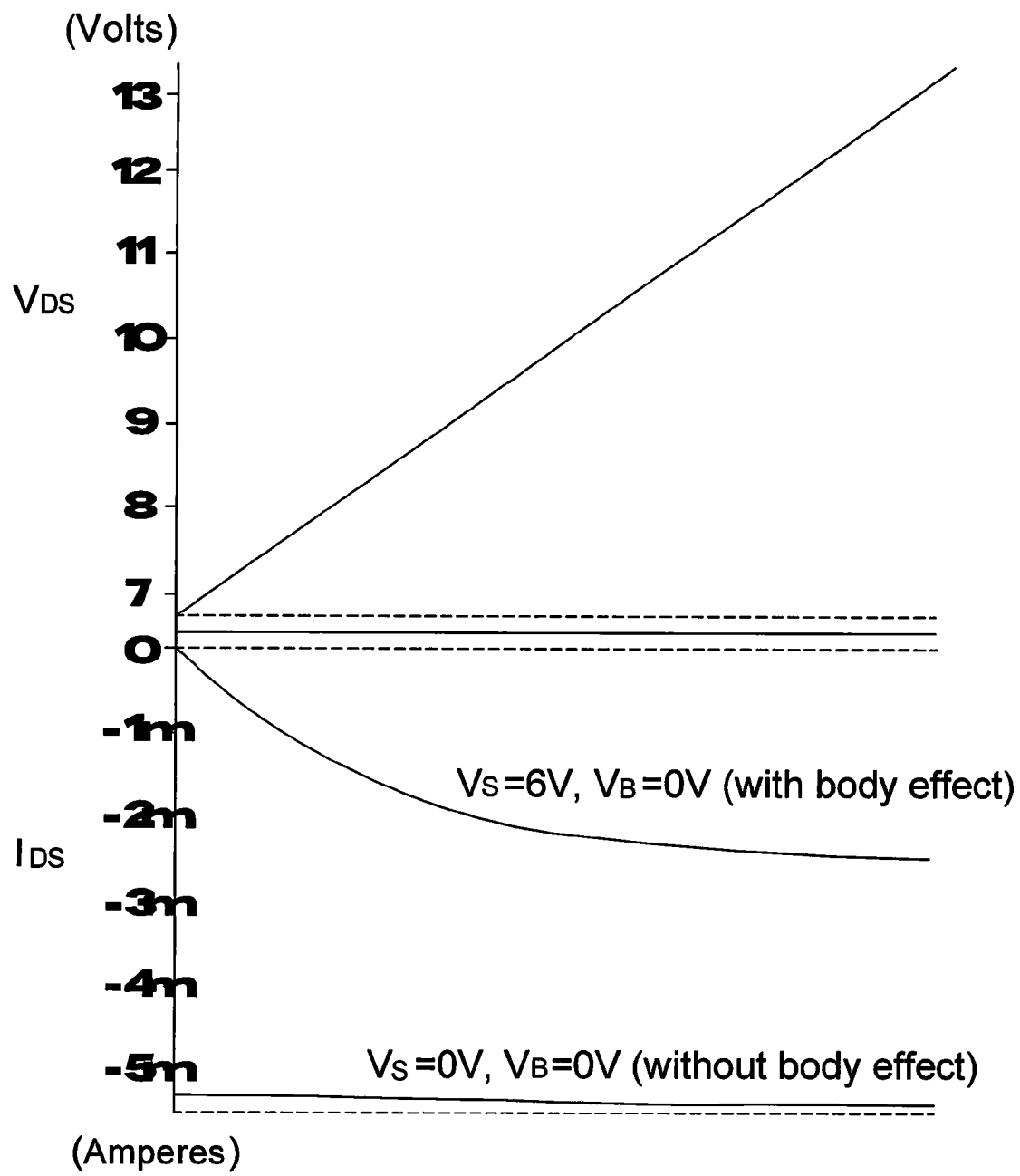
FIG. 3 compares voltage and current output characteristic curves of the transistors 223 and 224 in FIG. 2A.

FIG. 3 compares voltage and current output characteristic curves of the transistors 223 and 224 in FIG. 2A. As can be observed from FIG. 3, the NMOS transistor 223 with body effect can be used to sink current although the current of the NMOS transistor 223 is about half the current of the NMOS transistor 224. This feature is important for the invention. The NMOS transistor 223 with body effect still has great sink-current capability and thus allows to be applied in the output stage circuit 220 of the operational amplifier 200.

According to the invention, when the output voltage $V_{out}$ needs to be adjusted, the entire driving period of the operational amplifier 200 is divided into a transient period and a settling period. During the transient period, the transistor 221 with body effect or the transistor 223 with body effect is switched ON but transistors 222 and 224 without body effect are switched OFF in order to save the transient current upon the operational amplifier 200 making a state transition. During the settling period, the transistor 222 without body effect or the transistor 224 without body effect is switched ON but transistors 221 and 223 with body effect are switched OFF. The transient period and the settling period are allowed to be partially overlapped. That is, at the end of the transient period, the transistor 222 or the transistor 224 is firstly switched ON and then the transistors 221 and 223 are switched OFF. The operational amplifier 200 is operable even though one of the transistors 221 and 223 is not switched OFF during the settling period. In that case, more sink current are obtained to reduce the settling period. It should be noted that at least the transient period and the settling period are continuous. There is no time gap between the transient period and the settling period, otherwise the circuit will be floating. The lengths of the transient period and the settling period depend on the circuit requirement or the circuit load.

Figure 1:
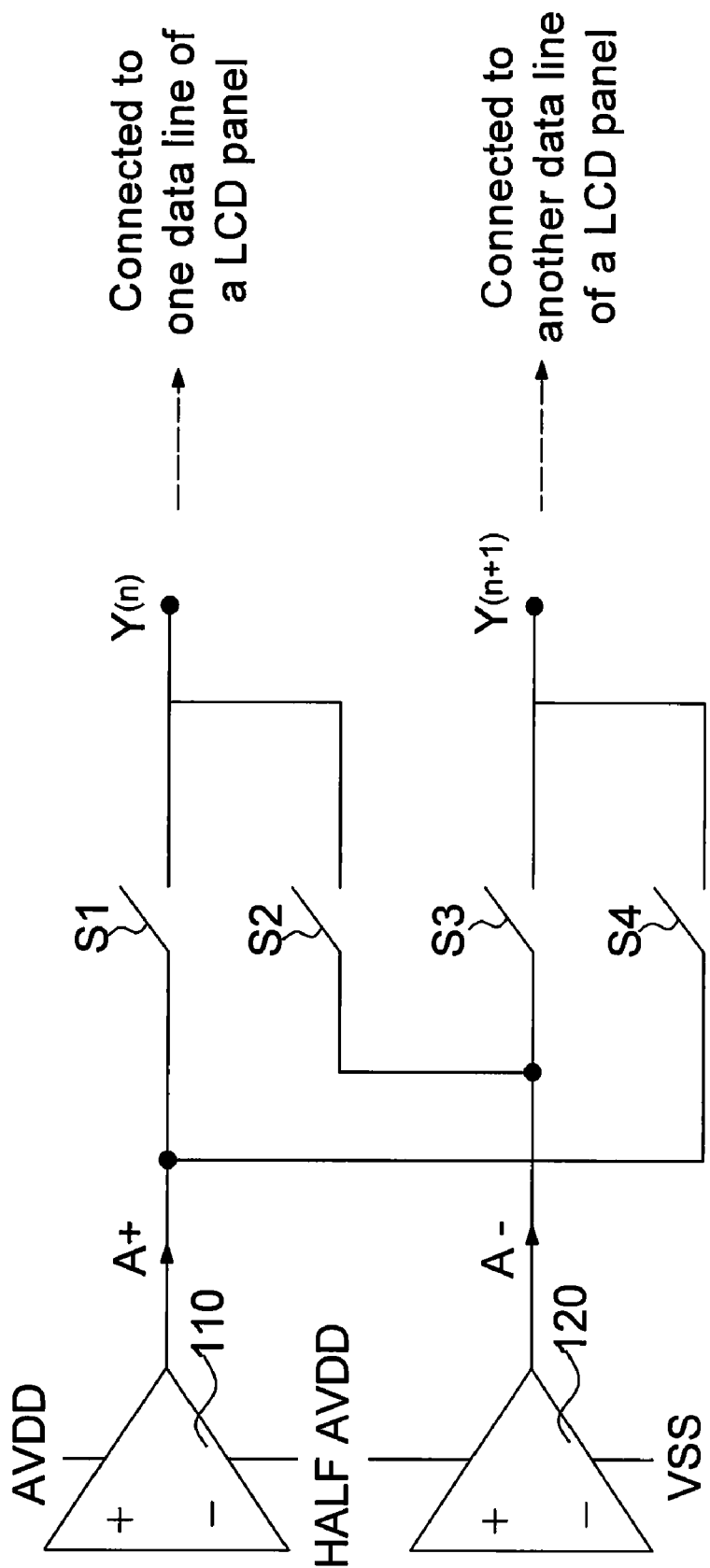
FIG. 1 is a schematic diagram showing two conventional operational amplifiers supporting the HALF AVDD structure and four switches located at two neighboring channels Y(n) and Y(n+1) in a source driver.
Figure 2B:
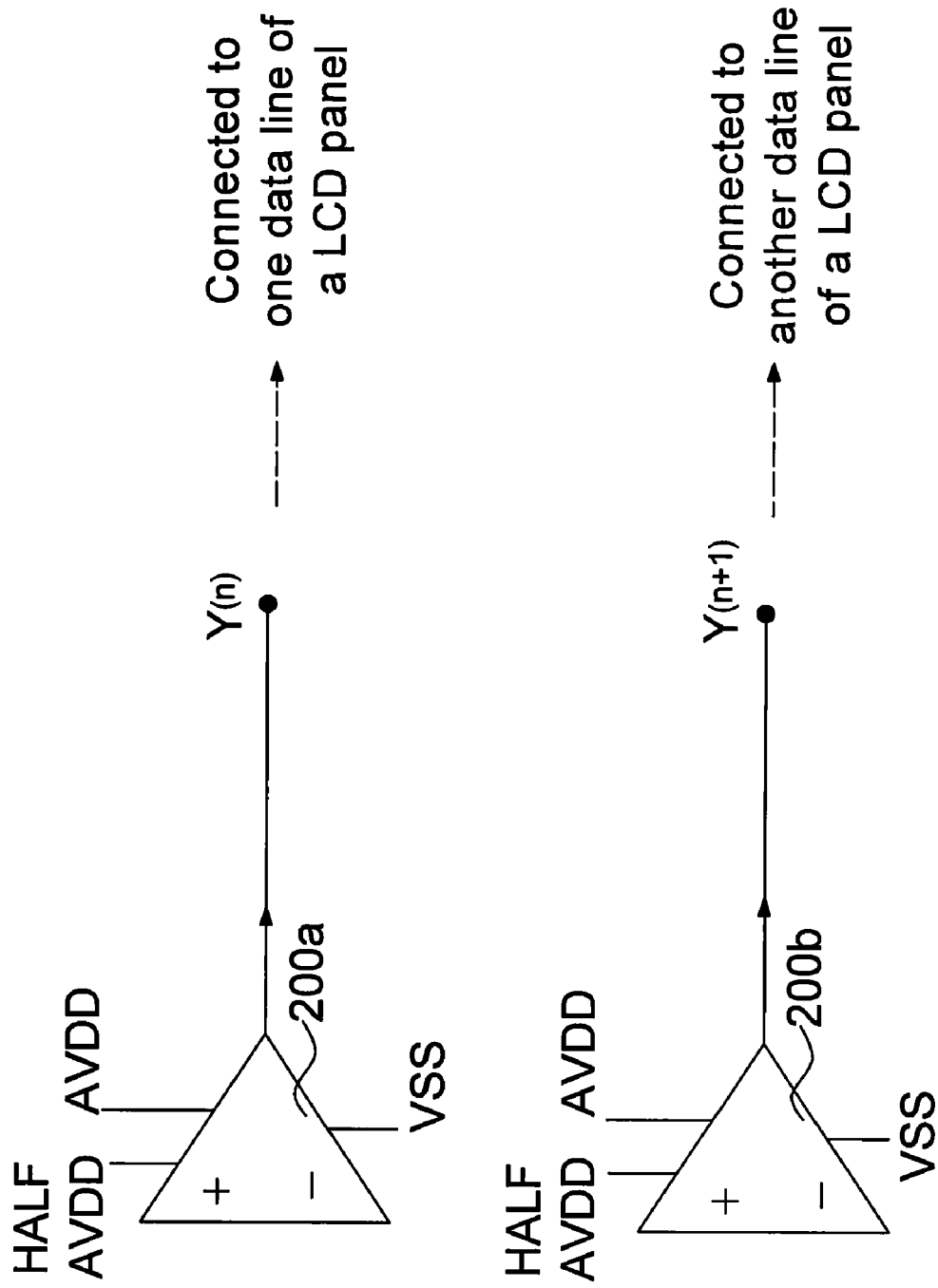
FIG. 2B is a schematic diagram showing two operational amplifiers of the invention located at two neighboring channels Y(n) and Y(n+1) in a source driver.

According to prior art, the operational amplifier 110, located at the channel Y(n), operates at AVDD and HALF AVDD; the operational amplifier 120, located at the channel Y(n+1), operates at HALF AVDD and VSS as shown in FIG. 1. By comparison, two operational amplifiers 200a and 200b of the invention, respectively located at two neighboring channels Y(n) and Y(n+1), are identical in circuit configuration and operating voltages (both the operational amplifiers 200a and 200b operate at AVDD, VSS and HALF AVDD) as shown in FIG. 2B. The predetermined polarity (will be described later in FIGS. 5A-5D) of the output voltage for each channel can be achieved since each of the operational amplifiers 200a and 200b controls a charge and discharge of its corresponding channel based on the HALF AVDD structure. Accordingly, the mechanism that the four switches S1-S4 in FIG. 1 alternately switch data polarities can be discarded.

In general, polarity inversion for LCD panels may be implemented in the following ways: frame inversion, row inversion, column inversion, dot inversion, two line dot inversion, and so on. It should be understood, however, that the invention is not limited to these particular polarity inversion techniques described above, but fully extensible to any existing or yet-to-be developed polarity inversion techniques. Hereinafter, operations of the operational amplifiers 200 of the invention will be described in detail with the two line dot inversion drive mode being taken as an example.

Figure 4:
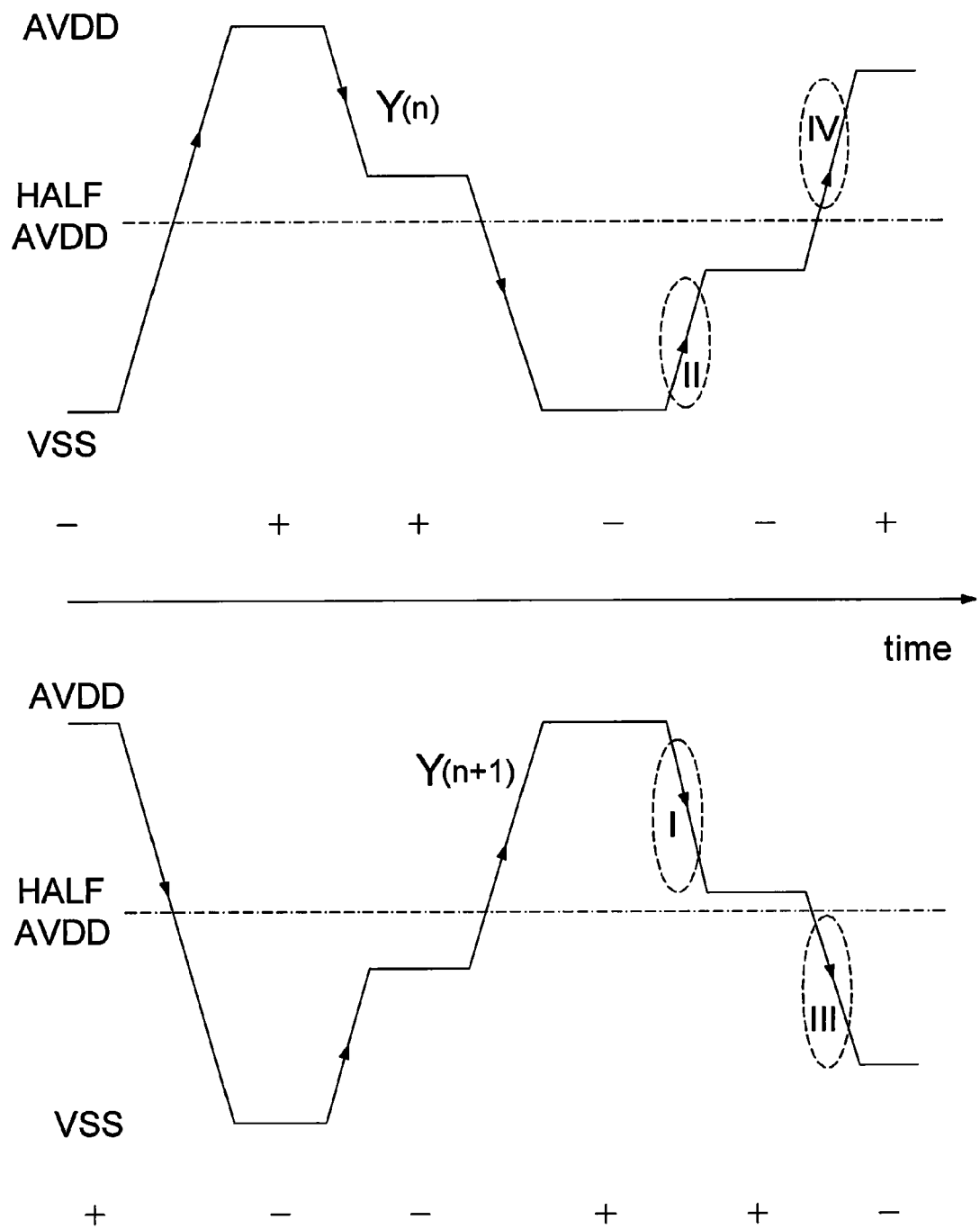
FIG. 4 is an example showing waveforms of the output voltages relating to the two neighboring channels Y(n) and Y(n+1) in a two line dot inversion drive mode.
Figure 5B:
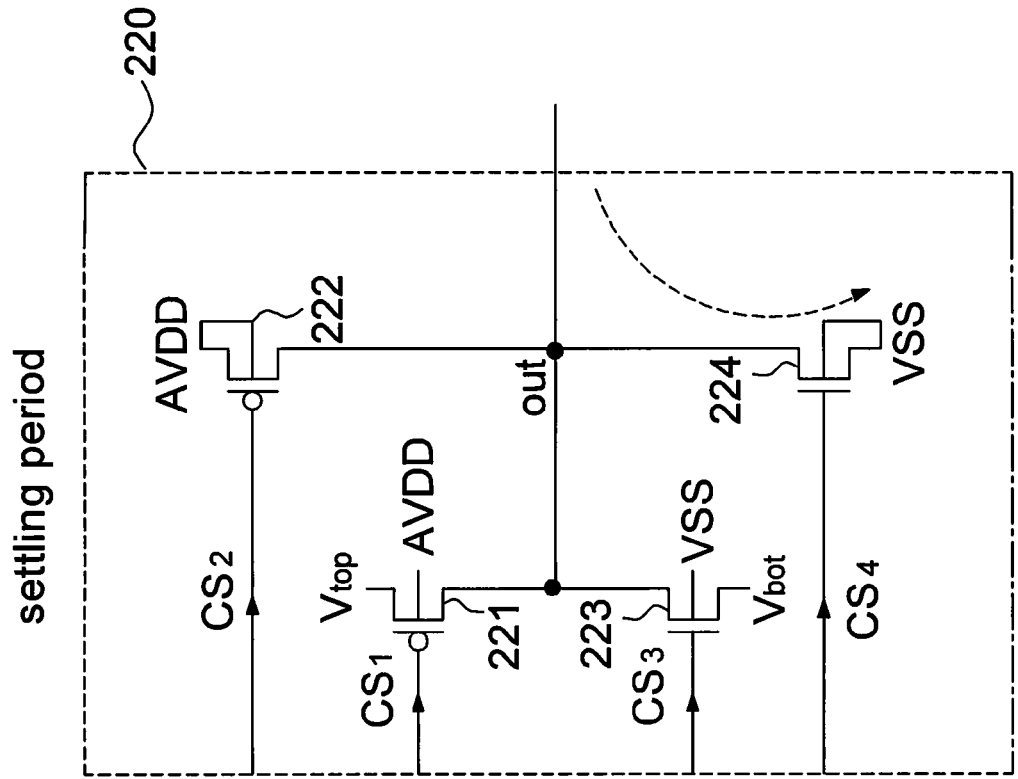
FIG. 5B is a diagram showing that a discharge path is created while the output stage circuit of the operational amplifier operates during the settling period according to the invention.
Figure 5A:
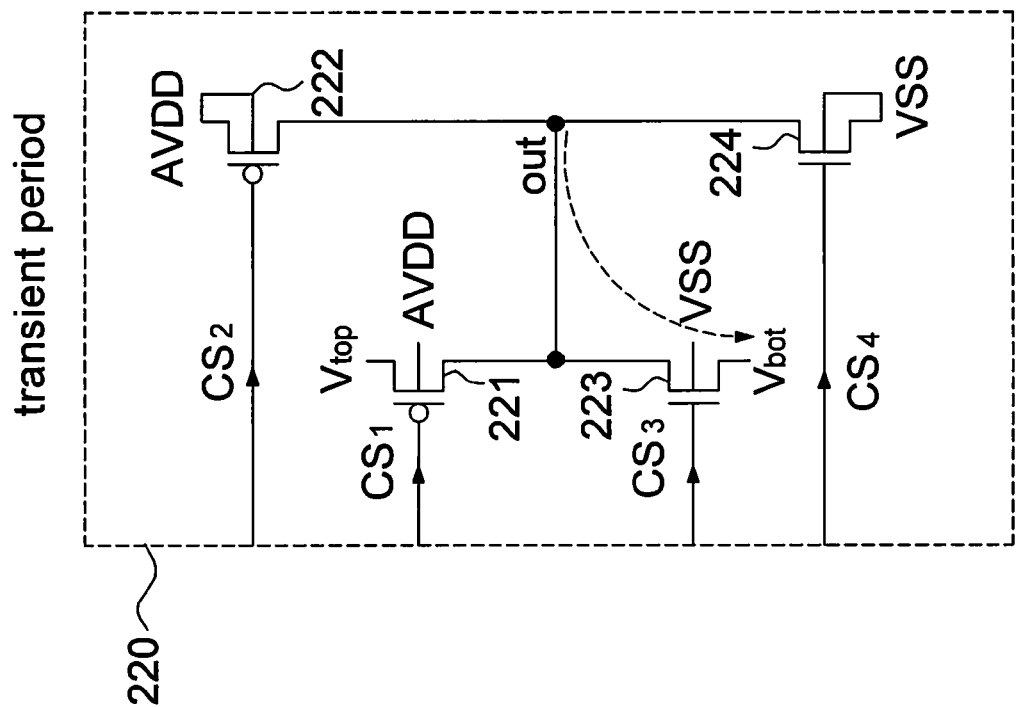
FIG. 5A is a diagram showing that a discharge path is created while the output stage circuit of the operational amplifier operates during the transient period according to the invention.
Figure 5D:
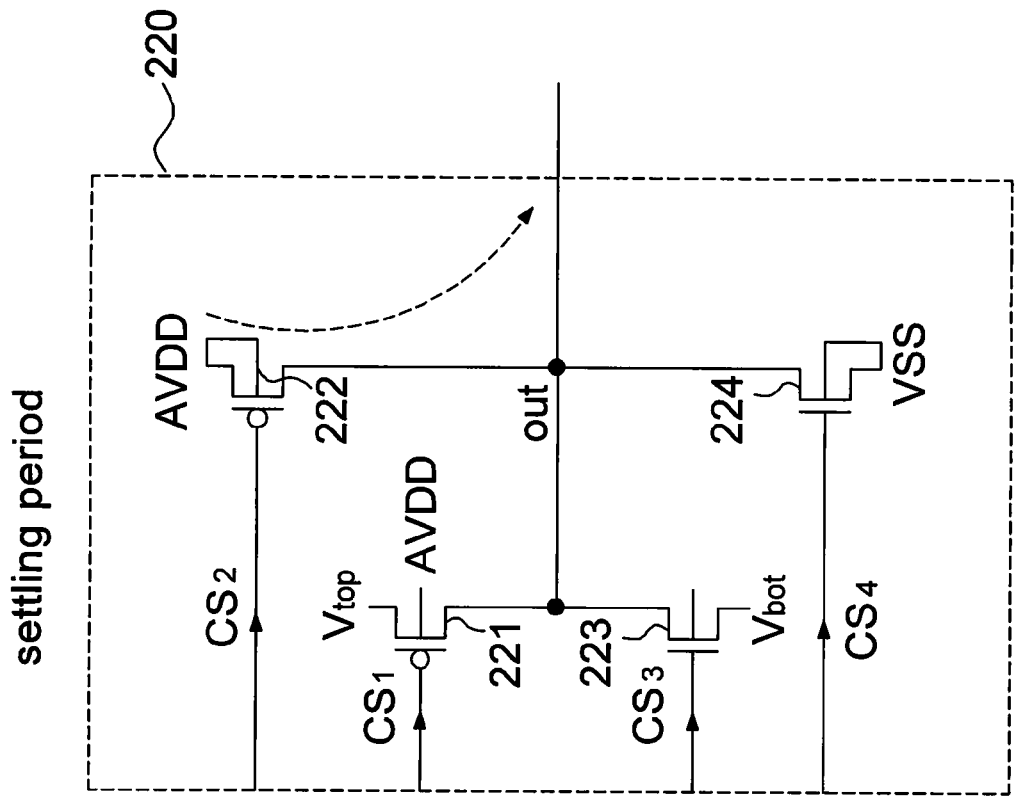
FIG. 5D is a diagram showing that a charge path is created while the output stage circuit of the operational amplifier operates during the settling period according to the invention.
Figure 5C:
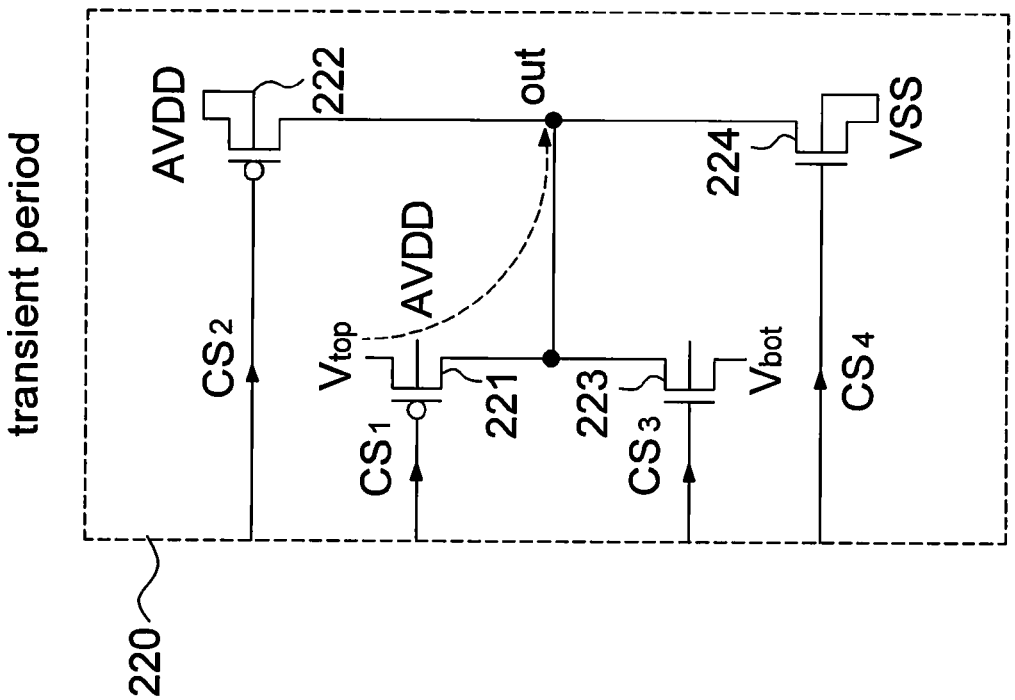
FIG. 5C is a diagram showing that a charge path is created while the output stage circuit of the operational amplifier operates during the transient period according to the invention.

FIG. 4 is an example showing waveforms of the output voltages relating to the two neighboring channels Y(n) and Y(n+1) in a two line dot inversion drive mode. FIG. 5A is a diagram showing that a discharge path is created while the output stage circuit of the operational amplifier operates during the transient period according to the invention. FIG. 5B is a diagram showing that a discharge path is created while the output stage circuit of the operational amplifier operates during the settling period according to the invention. FIG. 5C is a diagram showing that a charge path is created while the output stage circuit of the operational amplifier operates during the transient period according to the invention. FIG. 5D is a diagram showing that a charge path is created while the output stage circuit of the operational amplifier operates during the settling period according to the invention.

Referring now to FIGS. 2A and 5A, take a falling edge I of the output voltage relating to the channel Y(n+1) for example. When the polarities of the output voltage $V_{out}$ (equal to the negative input voltage V−) and the positive input voltage V+ of the operational amplifier 200 are positive, the entire driving period of the operational amplifier 200 is divided into the transient period and the settling period. At first, the operational amplifier 200 enters into the transient period and the input stage circuit 210 enables the control signal CS3 to turn on the NMOS transistor 223. The output voltage $V_{out}$ is pulled down by means of the operating voltage HALF AVDD. Thus, the discharge current flows along the path, indicated by the arrow shown in FIG. 5A, into the operating voltage HALF AVDD, where charges are collected in capacitors. Therefore, much power is saved. As the transient period ends, the settling period begins. The input stage circuit 210 enables the control signal CS4 to turn on the NMOS transistor 224 and then disables the control signal CS3 to turn off the NMOS transistor 223 (or continues enabling the control signal CS3 to turn on the NMOS transistor 223). Finally, the output voltage $V_{out}$ is rapidly pulled down to a target voltage by means of the operating voltage VSS. Thus, the discharge current flows along the path, indicated by the arrow shown in FIG. 5B, into the operating voltage VSS, where the charges cannot be collected.

On the other hand, if the output voltage $V_{out}$ has a falling edge and the polarity of at least one of the output voltage $V_{out}$ and the positive input voltage V+ is not positive (e.g., the falling edge III of the output voltage relating to the channel Y(n+1) shown in FIG. 4), the output voltage $V_{out}$ will be pulled down by means of the operating voltage VSS, where the charges cannot be collected. Accordingly, the entire driving period of the operational amplifier 200 includes a settling period only. The input stage circuit 210 directly enables the control signal CS4 to turn on the NMOS transistor 224 (or simultaneously enables the control signal CS3 to turn on the NMOS transistor 223). The output voltage $V_{out}$ is rapidly pulled down to a target voltage by means of the operating voltage VSS as shown in FIG. 5B.

Referring now to FIGS. 2A and 5C, take a rising edge II of the output voltage relating to the channel Y(n) for example. When both of the polarities of the output voltage $V_{out}$ and the positive input voltage V+ are negative, the entire driving period of the operational amplifier 200 is divided into the transient period and the settling period. At first, the operational amplifier 200 enters into the transient period and the input stage circuit 210 enables the control signal CS1 to turn on the PMOS transistor 221. The output voltage $V_{out}$ is pulled up by means of the operating voltage HALF AVDD. That is, the operating voltage HALF AVDD provides the charge current along the path, indicated by the arrow shown in FIG. 5C, in order to charge or pull up the output voltage $V_{out}$. It should be noted that, during this charge process, the charges employed to pull up the output voltage $V_{out}$ for the channel Y(n) are those that the output voltage $V_{out}$ relating to the channel Y(n+1) previously discharges into the operating voltage HALF AVDD. In other words, the charges collected in a load terminal relating to the channel Y(n+1) during the previous discharge processes can be provided for the channel Y(n) to pull up the load terminal during the current charge process, thereby saving the power supply of the operating voltage HALF AVDD. Likewise, as the transient period ends, the settling period begins. The input stage circuit 210 firstly enables the control signal CS2 to turn on the PMOS transistor 222 and then disables the control signal CS1 to turn off the PMOS transistor 221 (or continues enabling the control signal CS1 to turn on the PMOS transistor 221). The output voltage $V_{out}$ is rapidly pulled up to a target voltage by means of the operating voltage AVDD and then the charge current flows along the path, indicated by the arrow shown in FIG. 5D.

On the other hand, if the output voltage $V_{out}$ has a rising edge and the polarity of at least one of the output voltage $V_{out}$ and the positive input voltage V+ is not negative (e.g., the rising edge IV of the output voltage relating to the channel Y(n) shown in FIG. 4), the output voltage $V_{out}$ will be pulled up by means of the operating voltage AVDD, without using the charges that the channel Y(n+1) discharges into the operating voltage HALF AVDD during the previous discharge processes. Accordingly, the entire driving period of the operational amplifier 200 includes a settling period only. The input stage circuit 210 directly enables the control signal CS2 to turn on the PMOS transistor 222 (or simultaneously enables the control signal CS1 to turn on the PMOS transistor 221). The output voltage $V_{out}$ is rapidly pulled up to a target voltage by means of the operating voltage AVDD as shown in FIG. 5D.

Figure 6A:
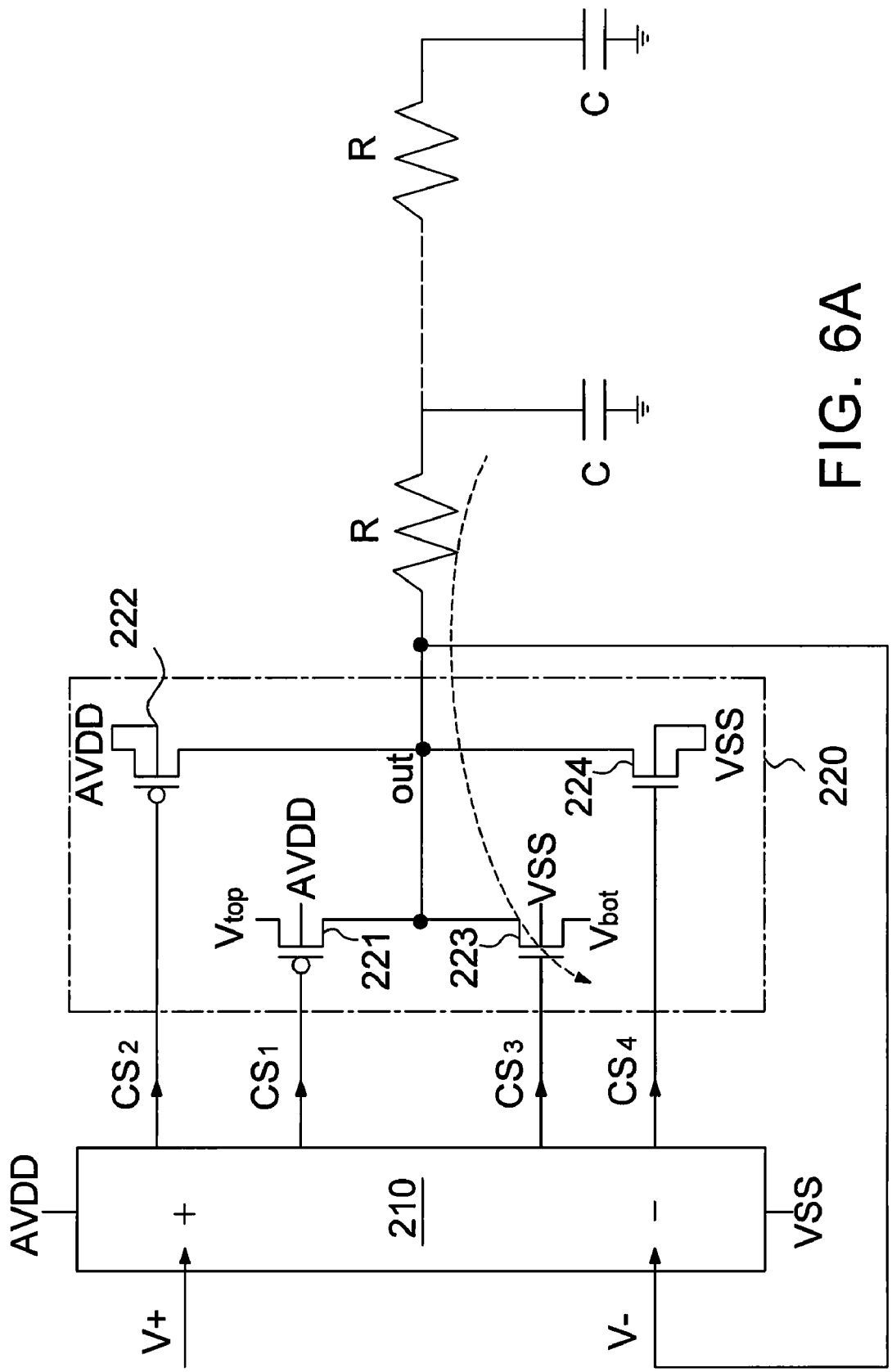
FIG. 6A is a circuit diagram showing the output terminal of the operational amplifier is connected with a load circuit to simulate the output voltage having a falling edge during the transient period.
Figure 6B:
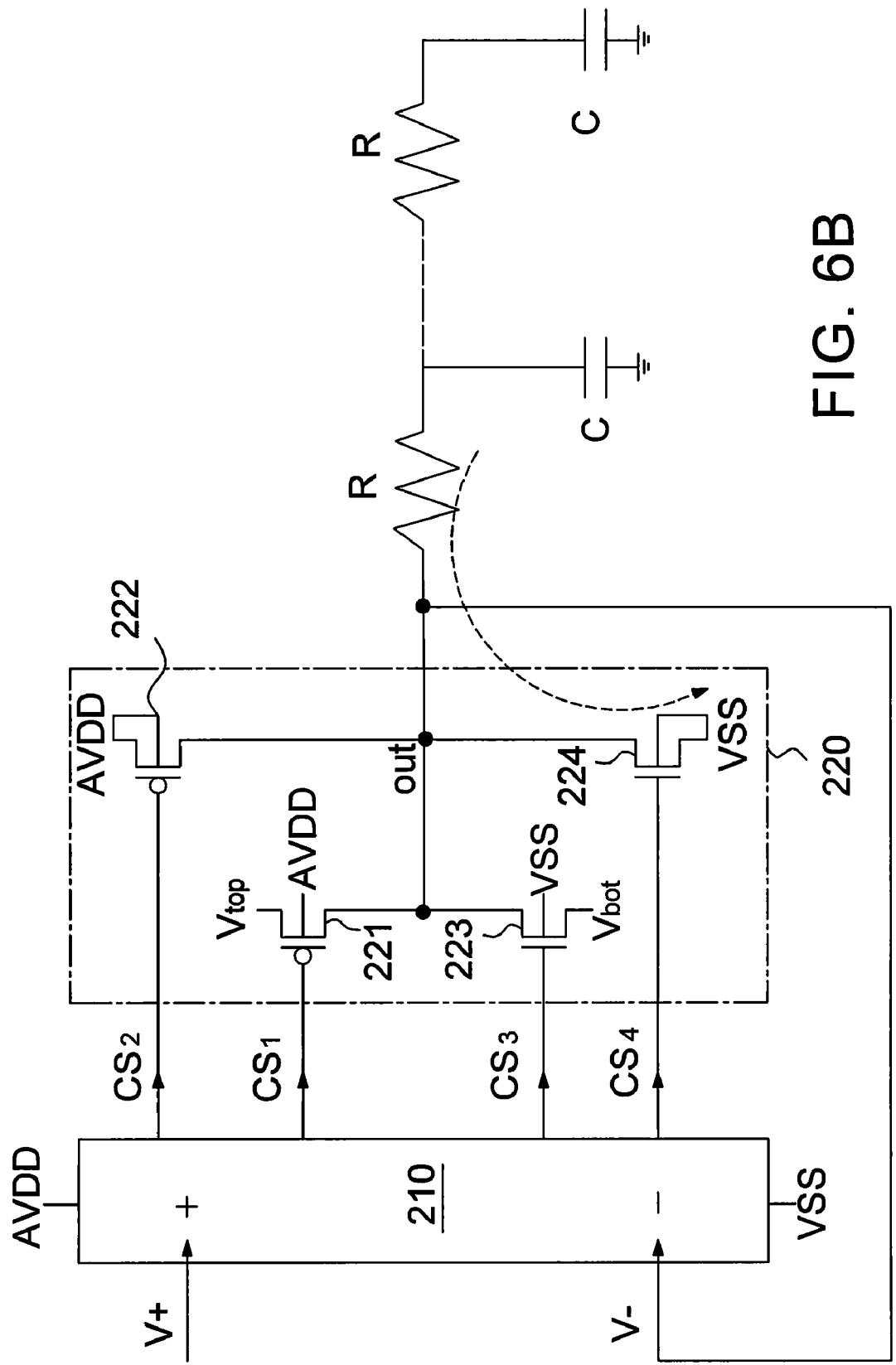
FIG. 6B is a circuit diagram showing the output terminal of the operational amplifier is connected with a load circuit to simulate the output voltage having a falling edge during the settling period.

FIG. 6A is a circuit diagram showing the output terminal of the operational amplifier is connected with a load circuit to simulate the output voltage having a falling edge during the transient period. FIG. 6B is a circuit diagram showing the output terminal of the operational amplifier is connected with a load circuit to simulate the output voltage having a falling edge during the settling period. FIG. 6C is a simulation result showing the output voltage $V_{out}$ of the operational amplifier according to circuit configurations in FIGS. 6A and 6B.

Referring to FIGS. 6A and 6B, a simulation experiment uses a Nth order RC-π model as a load circuit and the following data are selected for measurement: R=10K ohms, C=125 p farads, AVDD=13.5V and $V_{bot}$=6.75 V. Assuming that the initial voltage of the capacitor C is equal to 13.5V (that is, the output voltage $V_{out}$ is also equal to 13.5V) and the positive input voltage V+ is equal to 6.75V while the experiment starts. The circuit firstly enters into the transient period. The input stage circuit 210 enables the control signal CS3 to turn on the NMOS transistor 223. Thus, the discharge current flows along the path, indicated by the arrow shown in FIG. 6A, into the operating voltage HALF AVDD. Thus, the output voltage $V_{out}$ is pulled down from 13.5V to around 7V. As the transient period ends, the settling period begins. The input stage circuit 210 firstly enables the control signal CS4 to turn on the NMOS transistor 224 and then disables the control signal CS3 to turn off the NMOS transistor 223. After the circuit enters into the settling period, the output voltage $V_{out}$ is rapidly pulled down to a target voltage 6.75V as shown in FIG. 6C.

In summary, as can be observed from the operations of the operational amplifier of the invention, the output voltage level $V_{out}$ is adjusted by switching the control signals CS1, CS2, CS3 and CS4, without switching power supplies (e.g., VSS, AVDD and HALF AVDD). According to the invention, since the circuit connections between all MOS transistors and the power supplies are fixed and the IC does not perform any power switching, the risk of a short circuit in the power supplies is completely avoided. As previously discussed, without using complex and expensive triple-well CMOS process, the output stage circuit of the operational amplifier of the invention is implemented using twin-well CMOS transistors and a specific circuit structure. In addition to supporting the HALF AVDD structure, the invention additionally saves the power consumption.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art.

What is claimed is:

1. An output stage circuit, comprising:
   a first PMOS transistor, the bulk of the first PMOS transistor being connected to a first operating voltage, the drain of the first PMOS transistor being connected to a first mid level voltage, and the gate of the first PMOS transistor being connected to a first control signal;
   a second PMOS transistor, the bulk and the source of the second PMOS transistor being connected to the first operating voltage, and the gate of the second PMOS transistor being connected to a second control signal;
   a first NMOS transistor, the drain of the first NMOS transistor being connected to a second mid level voltage, the bulk of the first NMOS transistor being connected to a second operating voltage, and the gate of the first NMOS transistor being connected to a third control signal, wherein the second operating voltage is less than the first operating voltage; and
   a second NMOS transistor, the source and the bulk of the second NMOS transistor being connected to the second operating voltage, and the gate of the second NMOS transistor being connected to a fourth control signal;
   wherein the transistors are fabricated using twin-well CMOS process and the drains of the transistors are connected to each other at an output terminal, and wherein at least one of the control signals is enabled to turn on at least one of the transistors correspondingly for each time interval.

2. The circuit according to claim 1, wherein both of the first mid level voltage and the second mid level voltage are greater than the second operating voltage and less than the first operating voltage.

3. The circuit according to claim 2, wherein both of the first mid level voltage and the second mid level voltage are equal to the average of the second operating voltage and the first operating voltage.

4. The circuit according to claim 1, which the control signals are controlled by an input stage circuit of an operational amplifier.

5. The circuit according to claim 1, wherein, when the voltage at the output terminal needs to be pulled up, at least of the first control signal and the second control signal is enabled to turn on at least one of the first PMOS transistor and the second PMOS transistor correspondingly.

6. The circuit according to claim 1, wherein, when the voltage at the output terminal needs to be pulled down, at least one of the third control signal and the fourth control signal is enabled to turn on at least one of the first NMOS transistor and the second NMOS transistor correspondingly.

7. An operational amplifier having a positive input terminal, a negative input terminal and an output terminal, the negative input terminal and the output terminal being shorted together, the operational amplifier comprising:
   an input stage circuit that enables at least one of a first control signal, a second control signal, a third control signal and a fourth control signal according to two input voltages at the positive input terminal and the negative input terminal; and
   an output stage circuit, comprising:
   a first PMOS transistor, the bulk of the first PMOS transistor being connected to a first operating voltage, the drain of the first PMOS transistor being connected to a first mid level voltage, and the gate of the first PMOS transistor being connected to the first control signal;
   a second PMOS transistor, the bulk and the source of the second PMOS transistor being connected to the first operating voltage, and the gate of the second PMOS transistor being connected to the second control signal;
   a first NMOS transistor, the source of the first NMOS transistor being connected to a second mid level voltage, the bulk of the first NMOS transistor being connected to a second operating voltage, and the gate of the first NMOS transistor being connected to the third control signal; and
   a second NMOS transistor, the source and the bulk of the second NMOS transistor being connected to the second operating voltage, and the gate of the second NMOS transistor being connected to a fourth control signal, wherein the transistors are fabricated using twin-well CMOS process and the drains of the transistors are connected at the output terminal.

8. The amplifier according to claim 7, wherein both of the first mid level voltage and the second mid level voltage are greater than the second operating voltage and less than the first operating voltage.

9. The amplifier according to claim 8, wherein both of the first mid level voltage and the second mid level voltage are equal to the average of the second operating voltage and the first operating voltage.

10. The amplifier according to claim 7, wherein the input stage circuit operates at the second operating voltage and the first operating voltage.

11. The amplifier according to claim 7, wherein, when the voltage at the output terminal is to be pulled down, a driving period of the operational amplifier is divided into a first transient period and a first settling period if both of the two input voltages have positive polarities, and the driving period of the operational amplifier includes the first settling period only if otherwise.

12. The amplifier according to claim 11, wherein, when the operational amplifier operates in the first transient period, the input stage circuit enables the third control signal to turn on the first NMOS transistor.

13. The amplifier according to claim 11, wherein, when the operational amplifier operates during the first setting period, the input stage circuit enables the fourth control signal to turn on the second NMOS transistor.

14. The amplifier according to claim 13, wherein, when the operational amplifier operates during the first setting period, the input stage circuit further enables the third control signal to turn on the first NMOS transistor.

15. The amplifier according to claim 11, wherein the first transient period and the first setting period are continuous or partially overlapped.

16. The amplifier according to claim 7, wherein, when the voltage at the output terminal is to be pulled up, a driving period of the operational amplifier is divided into a second transient period and a second settling period if both of the input voltages have negative polarities, and the driving of the operational amplifier period includes the second settling period only if otherwise.

17. The amplifier according to claim 16, wherein, when the operational amplifier operates during the second transient period, the input stage circuit enables the first control signal to turn on the first PMOS transistor.

18. The amplifier according to claim 16, wherein, when the operational amplifier operates during the second setting period, the input stage circuit enables the second control signal to turn on the second PMOS transistor.

19. The amplifier according to claim 18, wherein, when the operational amplifier operates during the second setting period, the input stage circuit further enables the first control signal to turn on the first PMOS transistor.

20. The amplifier according to claim 16, wherein the second transient period and the second setting period are continuous or partially overlapped.

* * * * *